United States Patent
Lin et al.

(10) Patent No.: US 9,574,830 B2
(45) Date of Patent: Feb. 21, 2017

(54) MOUNTING BRACKET FOR HEAT DISSIPATION DEVICE HAVING FINS

(75) Inventors: Sheng-Huang Lin, New Taipei (TW); Yen-Lin Chu, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 811 days.

(21) Appl. No.: 13/430,016

(22) Filed: Mar. 26, 2012

(65) Prior Publication Data
US 2013/0248145 A1    Sep. 26, 2013

(51) Int. Cl.
| | |
|---|---|
| F28F 7/00 | (2006.01) |
| F28F 9/00 | (2006.01) |
| H05K 7/20 | (2006.01) |
| F28D 15/02 | (2006.01) |
| F28F 1/32 | (2006.01) |
| B23P 15/26 | (2006.01) |

(52) U.S. Cl.
CPC ............. *F28F 9/00* (2013.01); *B23P 15/26* (2013.01); *F28D 15/0275* (2013.01); *F28F 1/32* (2013.01); *H05K 7/2049* (2013.01); *Y10T 29/4935* (2015.01)

(58) Field of Classification Search
CPC ........... F28F 9/00; F28F 1/32; F28F 1/325; F28F 1/24; F28D 15/0275; H01L 23/427; H01L 23/3672; H01L 23/40; H05K 7/2049
USPC ................................ 165/80.3, 67; 361/704
See application file for complete search history.

(56) References Cited

U.S. PATENT DOCUMENTS

| | | | | |
|---|---|---|---|---|
| 5,509,465 A | * | 4/1996 | Lai ............................... | 165/80.3 |
| 6,006,827 A | * | 12/1999 | Lu ............................. | F28F 1/30 |
| | | | | 165/104.33 |
| 6,008,989 A | * | 12/1999 | Lee ......................... | G06F 1/183 |
| | | | | 174/16.3 |
| 6,244,332 B1 | * | 6/2001 | Gesklin et al. .............. | 165/80.3 |
| 6,246,584 B1 | * | 6/2001 | Lee ..................... | H01L 23/4093 |
| | | | | 24/458 |
| 6,341,644 B1 | * | 1/2002 | Lo ...................... | H01L 23/4093 |
| | | | | 165/80.3 |
| 6,968,889 B2 | * | 11/2005 | Wang .................. | H01L 23/4006 |
| | | | | 165/185 |
| 7,350,561 B2 | * | 4/2008 | Deng et al. ................. | 165/80.3 |

(Continued)

FOREIGN PATENT DOCUMENTS

| | | |
|---|---|---|
| CN | 202601607 U | 12/2012 |
| TW | M329960 U | 4/2008 |
| TW | 201004550 A | 1/2010 |

*Primary Examiner* — Judy Swann
*Assistant Examiner* — Jose O Class-Quinones
(74) *Attorney, Agent, or Firm* — C. G. Mersereau; Nikolai & Mersereau, P.A.

(57) ABSTRACT

A heat dissipation device includes a mounting bracket and a thermal module. The mounting bracket has at least one retaining hole and a mounting section, and the thermal module includes a plurality of radiating fins, to which the mounting bracket is connected. On the radiating fins, at least one engaging zone is provided for correspondingly engaging with the mounting bracket, and at least one locking portion is formed for correspondingly engaging with the retaining hole. With the above structural design, the mounting bracket can be more firmly and stably connected to the thermal module and be more accurately located on the radiating fins without the need of welding, so that the manufacturing cost for welding is saved. A method of manufacturing the heat dissipation device is also disclosed.

4 Claims, 13 Drawing Sheets

(56) References Cited

U.S. PATENT DOCUMENTS

| | | | | |
|---|---|---|---|---|
| 7,385,825 B2 * | 6/2008 | Xia | ................... | H01L 23/4093 |
| | | | | 165/80.3 |
| 7,613,005 B2 * | 11/2009 | Kuo | ................... | H01L 23/4006 |
| | | | | 165/185 |
| 7,697,294 B2 * | 4/2010 | Li et al. | ........................ | 361/709 |

* cited by examiner

MOUNTING BRACKET FOR HEAT DISSIPATION DEVICE HAVING FINS

FIELD OF THE INVENTION

The present invention relates to a heat dissipation device, and more particularly to a heat dissipation device, of which a mounting bracket and a thermal module can be firmly connected to each other without the need of welding and the mounting bracket can be more accurately located on the thermal module. The present invention also relates to a method of manufacturing the above-described heat dissipation device.

BACKGROUND OF THE INVENTION

Thanks to the constant progress in the technological fields, electronic elements, such as the central processing unit in a computer, now have faster and faster operating speed. As a result, heat dissipation devices have become one of indispensable devices for dissipating the heat produced by the electronic elements operating at high speed. Meanwhile, it has also become very important as how to conveniently but reliably mount the heat dissipation devices on the electronic elements at reduced cost.

Please refer to FIGS. 1A and 1B. Generally, there are two ways for fixedly mounting a currently commercially available heat dissipation device 1 to an electronic element via a mounting bracket. In a first one of the two ways, the mounting bracket 11 is directly welded to one side of the heat dissipation device 1, as shown in FIG. 1A, so that the mounting bracket 11 and the heat dissipation device 1 are connected to each other. In the other way, at least one engaging zone 101 is first formed on the radiating fins 10 of the heat dissipation device 1, as shown in FIG. 1B, and the mounting bracket 11 is positioned in the engaging zone 101. Thereafter, weld the mounting bracket 11 to the engaging zone 101, so that the mounting bracket 11 is not easily separated from the heat dissipation device 1.

Both of the above-mentioned ways require welding to firmly connect the mounting bracket 11 to the heat dissipation device, and then, the heat dissipation device 1 is secured to the electronic element via the mounting bracket 11. It is possibly the mounting bracket 11 is not securely welded to a correct position on the heat dissipation device 1, and the welding is possibly to cause process hazard and other problems related to environmental protection. Moreover, the costs for materials and parts needed in welding also result in increased manufacturing cost of the heat dissipation device 1.

In brief, the prior art heat dissipation devices have the following disadvantages: (1) the mounting bracket is subject to incorrect location on the heat dissipation device; (2) the connection of the mounting bracket to the heat dissipation device is not sufficiently secured; and (3) an increased manufacturing cost is required.

It is therefore tried by the inventor to develop an improved heat dissipation device and a method of manufacturing same, so as to overcome the disadvantages in the prior art.

SUMMARY OF THE INVENTION

A primary object of the present invention is to provide a heat dissipation device, of which a mounting bracket and a thermal module can be firmly connected to each other, and the mounting bracket can be more accurately located on the thermal module.

Another object of the present invention is to provide a heat dissipation device, of which a mounting bracket and a thermal module can be firmly connected to each other without the need of welding, so that the manufacturing cost of the heat dissipation device can be lowered.

A further object of the present invention is to provide a method of manufacturing a heat dissipation device, of which a mounting bracket and a thermal module can be firmly connected to each other, and the mounting bracket can be more accurately located on the thermal module.

A still further object of the present invention is to provide a method of manufacturing a heat dissipation device, of which a mounting bracket and a thermal module can be firmly connected to each other without the need of welding, so that the manufacturing cost of the heat dissipation device can be lowered.

To achieve the above and other objects, the heat dissipation device according to the present invention includes a mounting bracket and a thermal module. The mounting bracket has at least one retaining hole and a mounting section, and the thermal module includes a plurality of radiating fins, to which the mounting bracket is connected. On the radiating fins, at least one engaging zone is provided for engaging with the mounting bracket, and at least one locking portion is formed for correspondingly engaging with the retaining hole.

To achieve the above and other objects, the heat dissipation device manufacturing method according to the present invention includes the following steps:

Providing a mounting bracket having at least one retaining hole and a mounting section;

Providing a thermal module including a plurality of radiating fins for engaging with the mounting bracket; on the radiating fins, at least one engaging zone being provided for correspondingly engaging with the mounting bracket, and at least one locking portion being formed for correspondingly engaging with the retaining hole on the mounting bracket; and Positioning the mounting bracket in the engaging zone, and applying an amount of pressure on the at least one locking portion, so that the locking portion is brought to extend into and become held in the retaining hole on the mounting bracket, bringing the mounting bracket and the thermal module to connect to each other.

With the heat dissipation device and the method of manufacturing same according to the present invention, the locking portions on the radiating fins are mechanically processed to extend into and engage with the retaining hole without the need of welding, so that the mounting bracket and the thermal module are more firmly connected to each other while the mounting bracket is more accurately located on the thermal module, and the cost for welding is saved to reduce the overall manufacturing cost.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
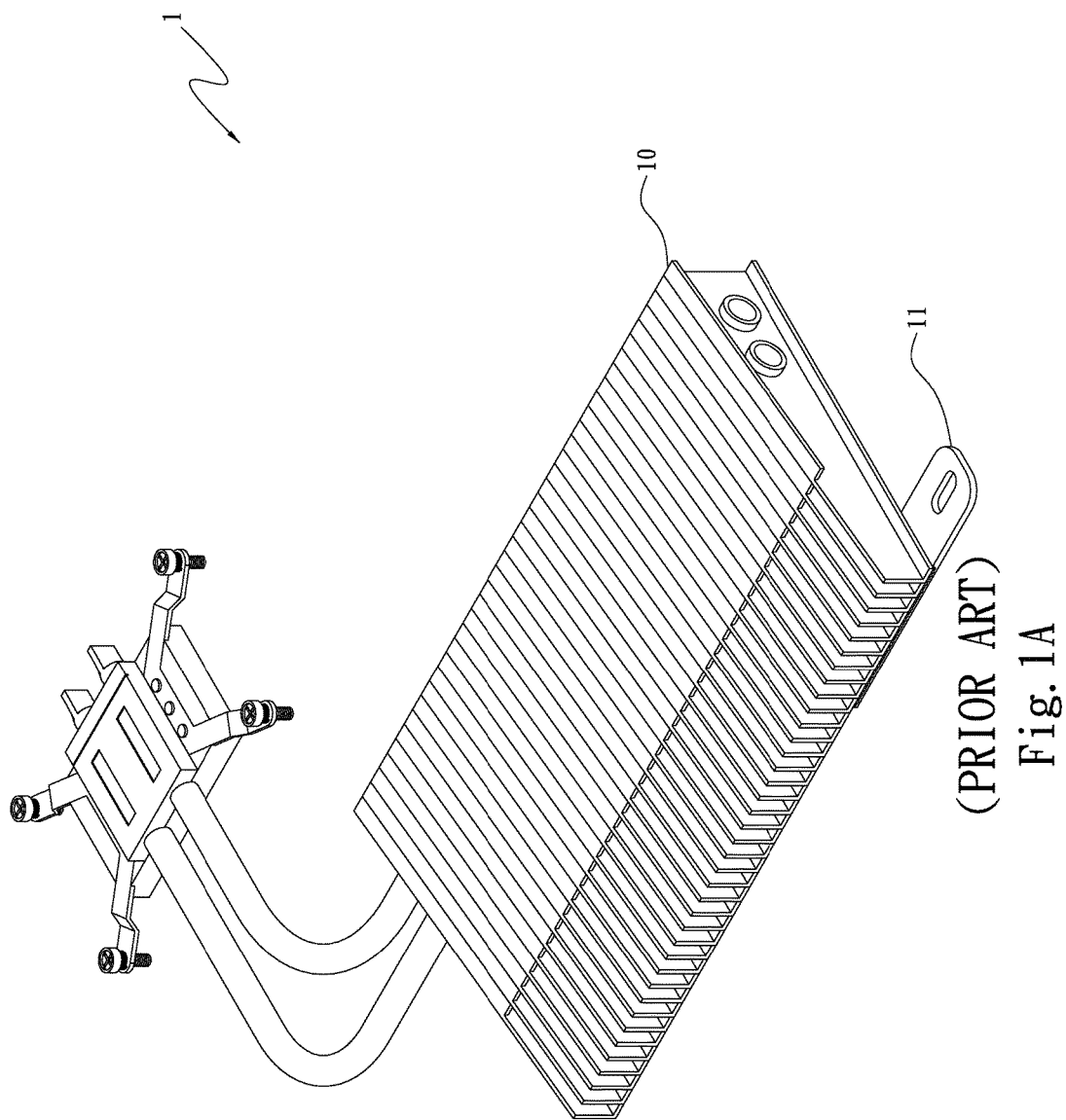
FIG. 1A is an assembled perspective view of a first conventional heat dissipation device.
Figure 1B:
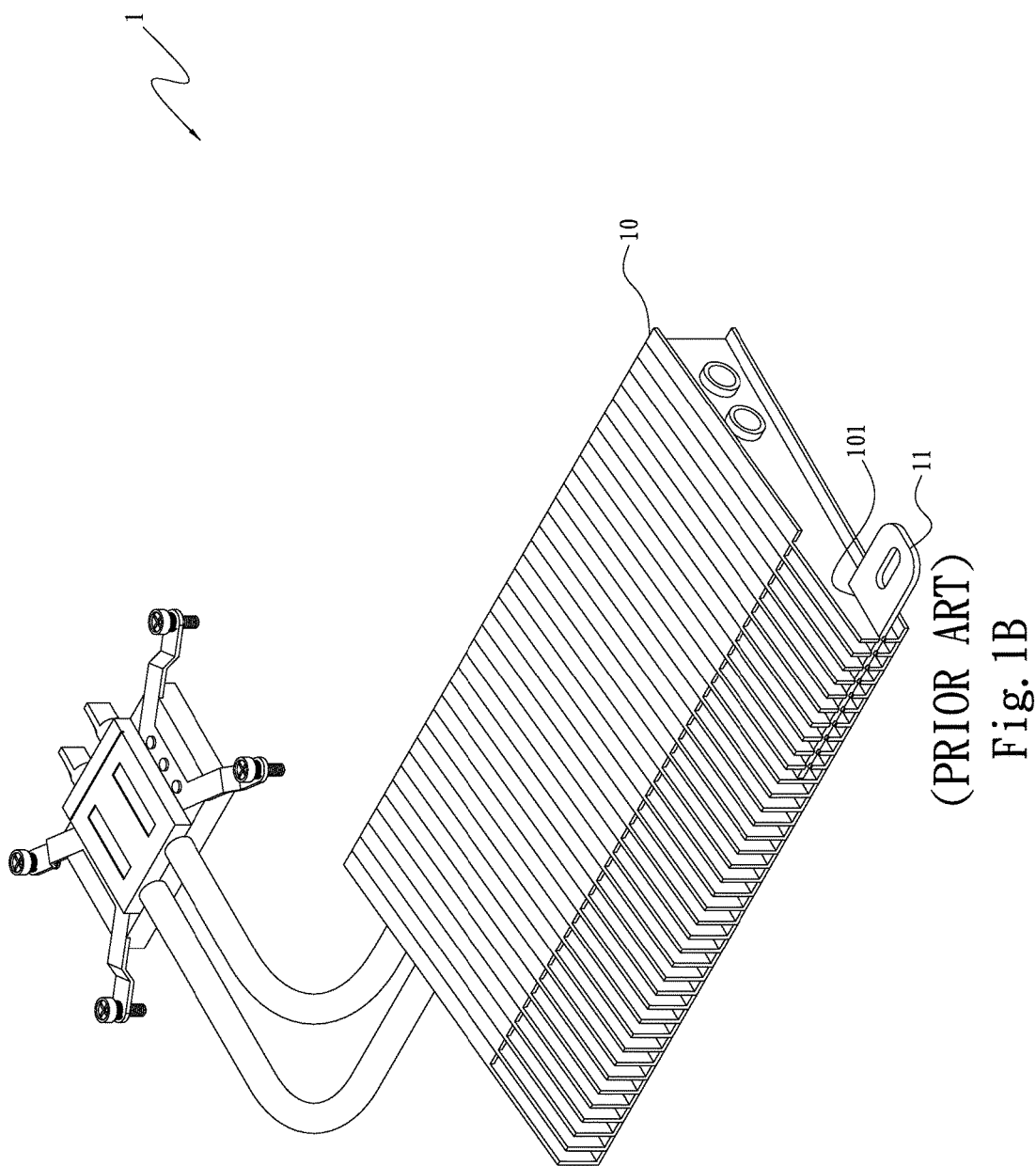
FIG. 1B is an assembled perspective view of a second conventional heat dissipation device.

The present invention will now be described with some preferred embodiments thereof and with reference to the accompanying drawings. For the purpose of easy to understand, elements that are the same in the preferred embodiments are denoted by the same reference numerals.

Figure 2A:
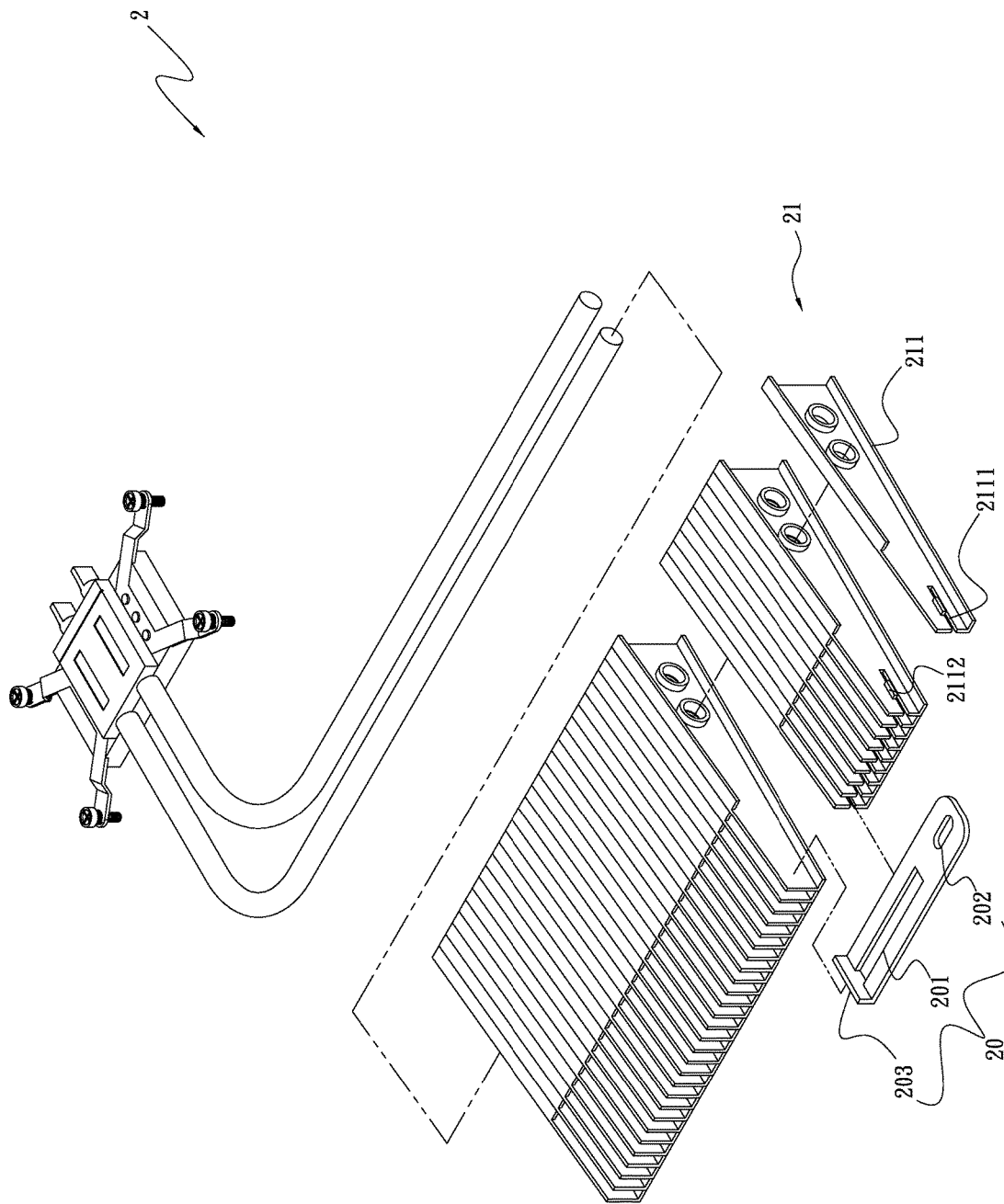
FIG. 2A is an exploded perspective view of a heat dissipation device according to a first embodiment of the present invention.
Figure 2B:
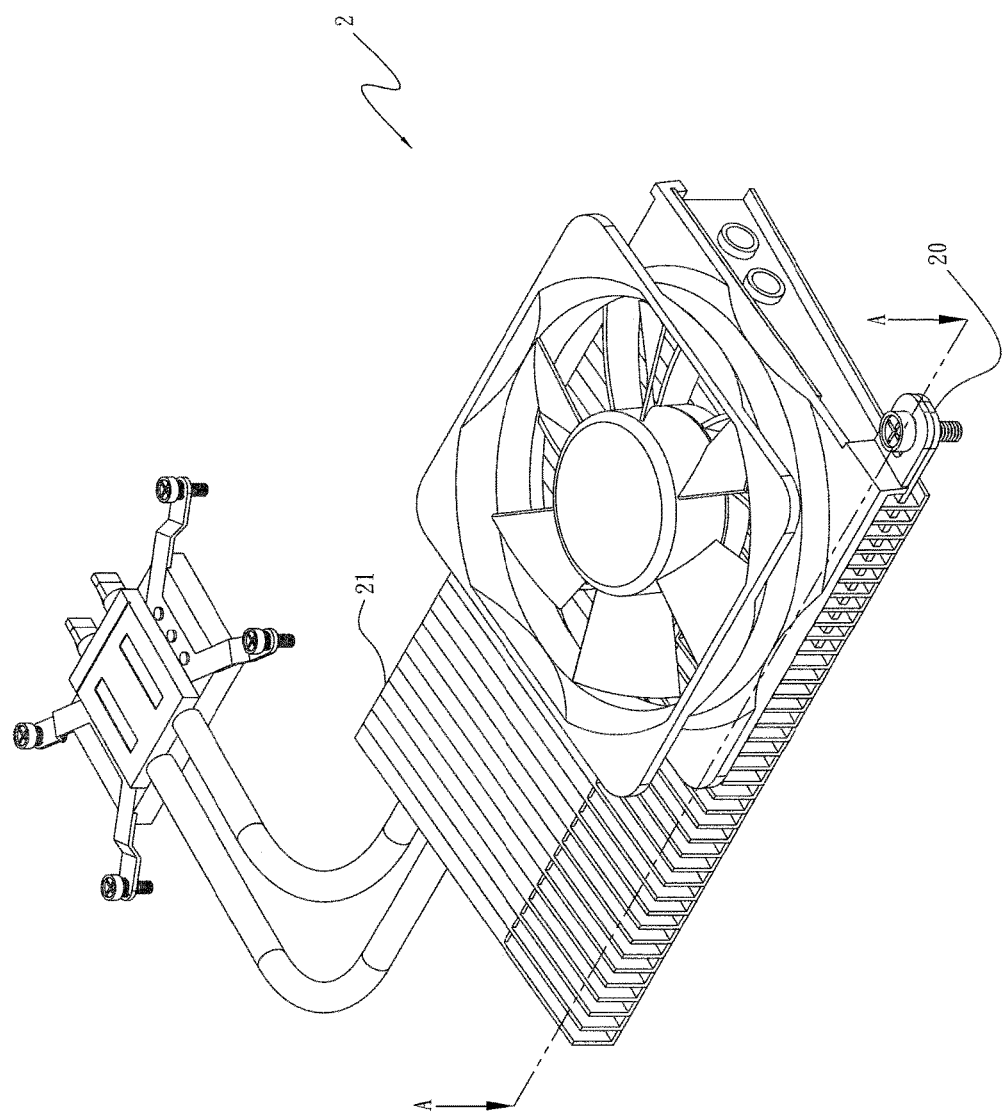
FIG. 2B is an assembled view of FIG. 2A.

Please refer to FIGS. 2A and 2B that are exploded and assembled perspective views, respectively, of a heat dissipation device 2 according to a first embodiment of the present invention. As shown, the heat dissipation device 2 includes a mounting bracket 20 and a thermal module 21. The mounting bracket 20 has at least one retaining hole 201 and a mounting section 202. The heat dissipation device 2 is connected at the mounting section 202 to an electronic element (not shown).

The thermal module 21 includes a plurality of radiating fins 211, to which the mounting bracket 20 is connected. On the radiating fins 211, at least one engaging zone 2111 is provided for correspondingly engaging with the mounting bracket 20. The radiating fins 211 respectively have at least one locking portion 2112 formed thereon for correspondingly engaging with the retaining hole 201 on the mounting bracket 20.

The locking portions 2112 can be brought to engage with the retaining hole 201 on the mounting bracket 20 by way of mechanical processing. In the illustrated first embodiment, the locking portions 2112 are caused to engage with the retaining hole 201 by way of stamping without being limited thereto.

Figure 3A:
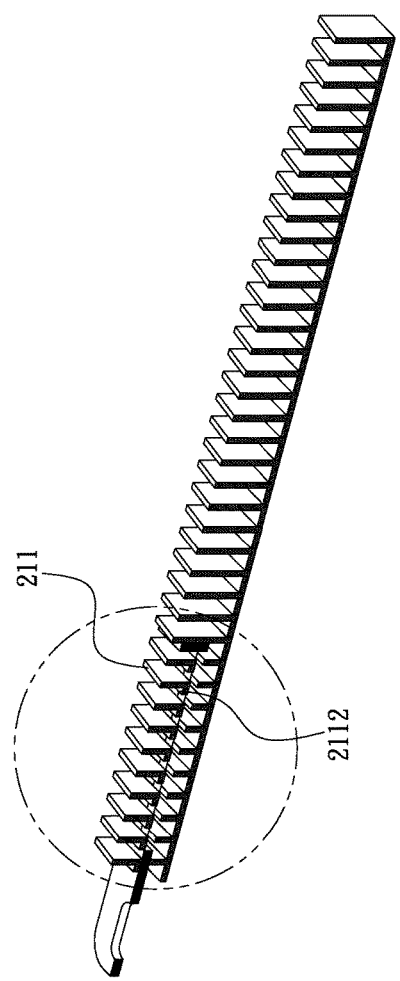
FIG. 3A is a cross-sectional view taken along line A-A of FIG. 2B.
Figure 3B:
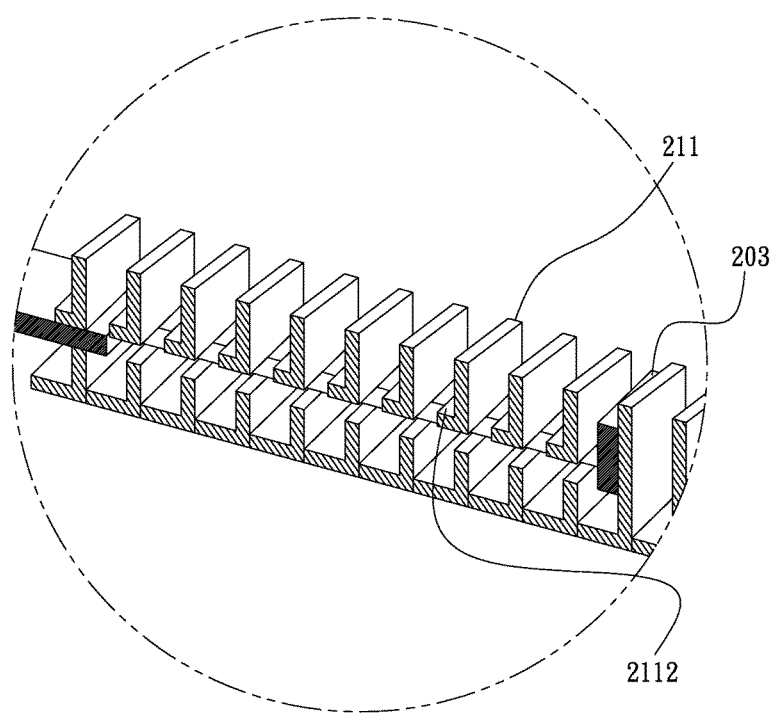
FIG. 3B is an enlarged view of the circled area of FIG. 3A.
Figure 3C:
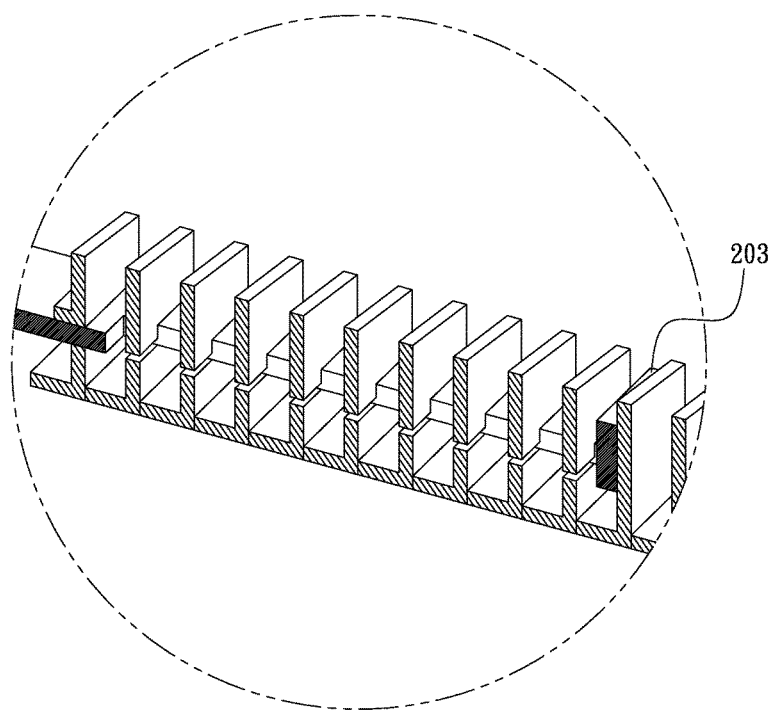
FIG. 3C is another enlarged view similar to FIG. 3B but with a plurality of locking portions on a thermal module engaged with a retaining hole on a mounting bracket.

FIG. 3A is a cross-sectional view taken along line A-A of FIG. 2B, and FIGS. 3B and 3C are enlarged views corresponding to the circled area in FIG. 3A. Please refer to FIGS. 3A, 3B and 3C along with FIGS. 2A and 2B. As shown, with the structural design of the above-described heat dissipation device 2, the mounting bracket 20 can be firmly and stably connected to the thermal module 21 when the locking portions 2112 on the radiating fins 211 are brought to extend into and held in the retaining hole 201, and the mounting bracket 20 can be located in place on the thermal module 21 with high accuracy. In addition, it is able to save the cost for welding the mounting bracket 20 to the thermal module 21.

As can be seen in FIG. 2A, the mounting bracket 20 further has at least one stopper portion 203 for inserting in between two adjacent radiating fins 211. When the mounting bracket 20 is inserted into the engaging zone 2111 on the thermal module 21 from an open lateral side of the radiating fins 211, the stopper portion 203 of the mounting bracket 20 is received in between two adjacent radiating fins 211, enabling the mounting bracket 20 to more securely connect to the thermal module 21.

Figure 4A:
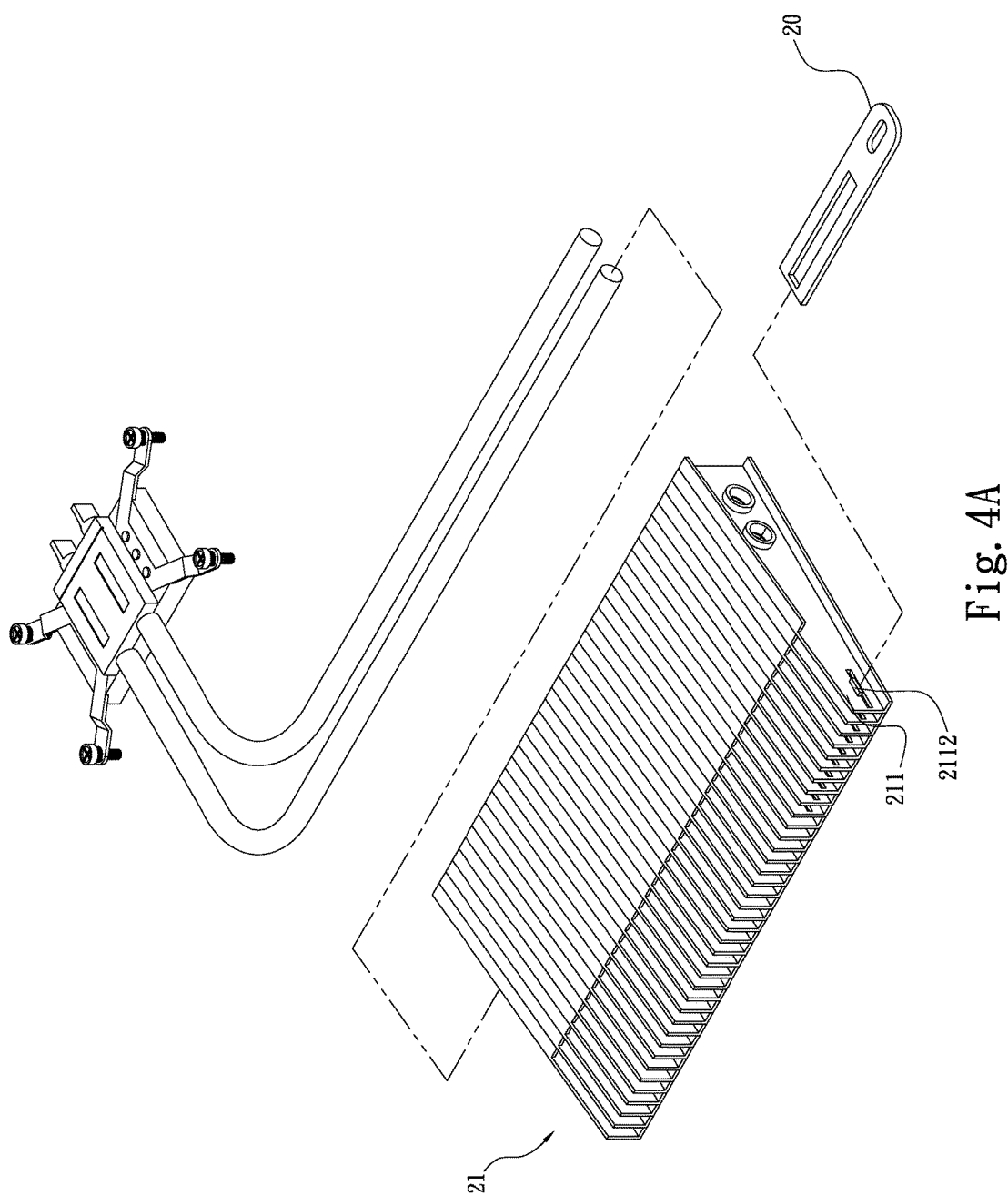
FIG. 4A is an exploded perspective view of a heat dissipation device according to a second embodiment of the present invention.
Figure 4B:
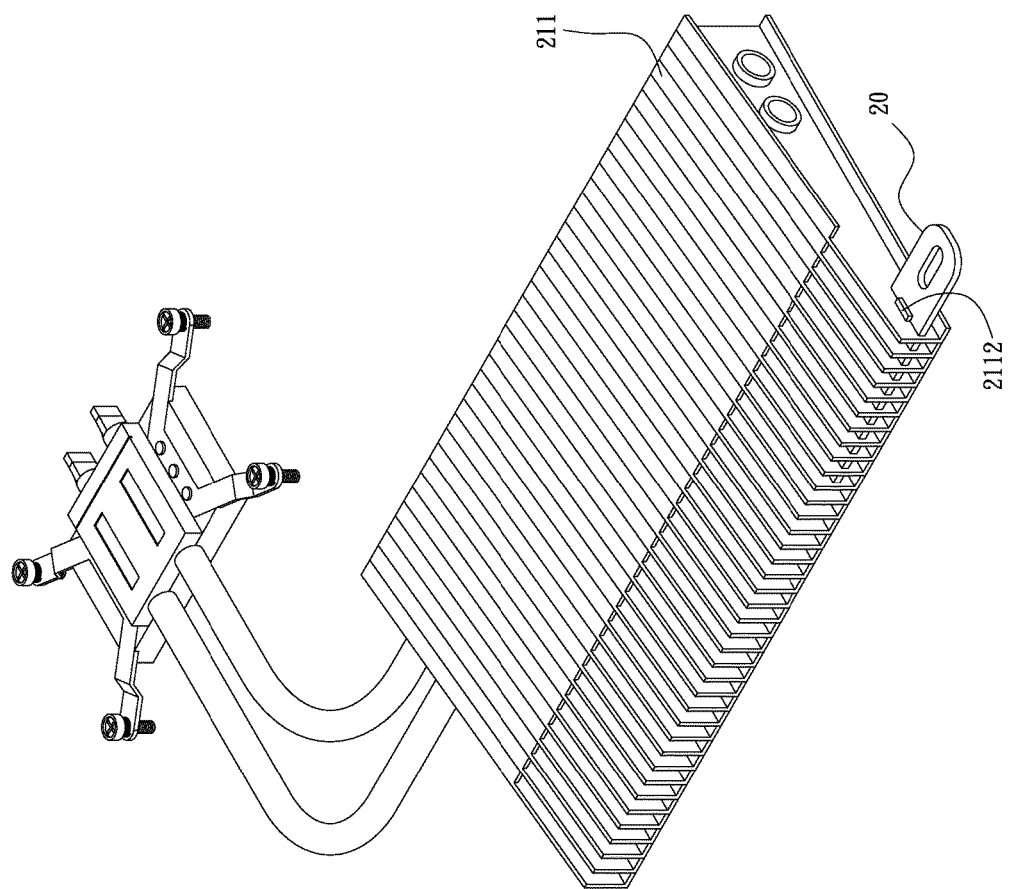
FIG. 4B is an assembled view of FIG. 4A.

FIGS. 4A and 4B are exploded and assembled perspective views, respectively, of a heat dissipation device according to a second embodiment of the present invention. As shown, the second embodiment is generally structurally similar to the first embodiment, except that the mounting bracket 20 in the second embodiment is a flat member without the stopper portion 203, and can therefore be moved into the engaging zone 2111 from an end surface of the assembled radiating fins 211 to connect to the thermal module 21. Similarly, in the second embodiment, the locking portions 2112 can be caused to extend into and held in the retaining hole 201 for the mounting bracket 20 to be highly accurately located in place on the thermal module 21.

Figure 5A:
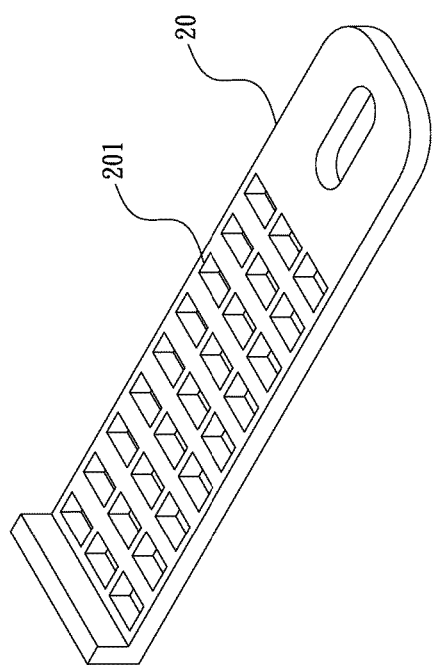
FIG. 5A is a perspective view of a mounting bracket for a heat dissipation device according to a third embodiment of the present invention.
Figure 5B:
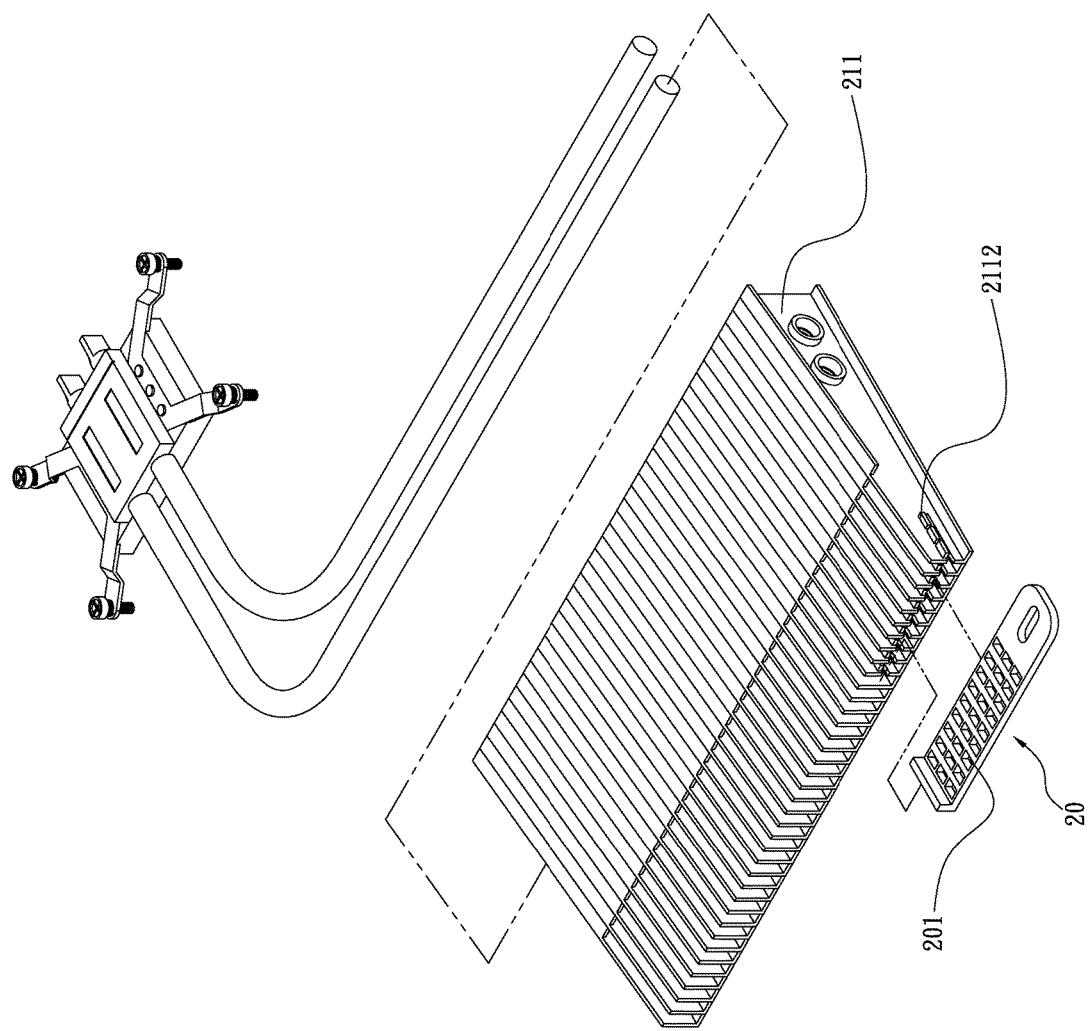
FIG. 5B is an exploded perspective view of the heat dissipation device according to the third embodiment of the present invention.
Figure 5C:
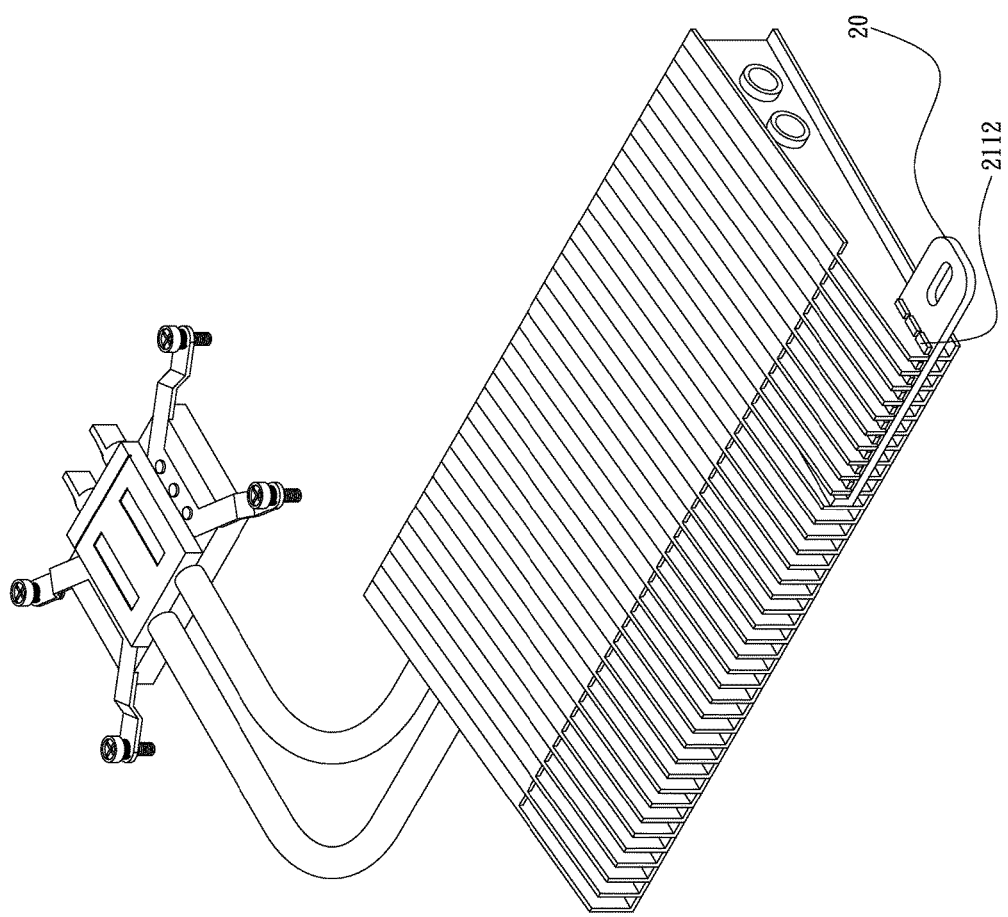
FIG. 5C is an assembled view of FIG. 5B.

FIG. 5A is a perspective view of a mounting bracket 20 for a heat dissipation device according to a third embodiment of the present invention, and FIGS. 5B and 5C are exploded and assembled perspective views, respectively, of the heat dissipation device in the third embodiment. As shown, the third embodiment is generally structurally similar to the first embodiment, except that the mounting bracket 20 in the third embodiment is provided with a plurality of retaining holes 201, which can be differently sized and arrayed on the mounting bracket 20 according to the widths, sizes, and number of the locking portions 2112 provided on the radiating fins 211. Again, with the locking portions 2112 being engaged with the retaining holes 201, the mounting bracket 20 can be securely connected to the thermal module 21, Further, it is not necessary for all the locking portions 2112 to engage with the retaining holes 201. A user may cause only some of the locking portions 2112 to engage with the retaining holes 201 according to actual need.

Figure 6:
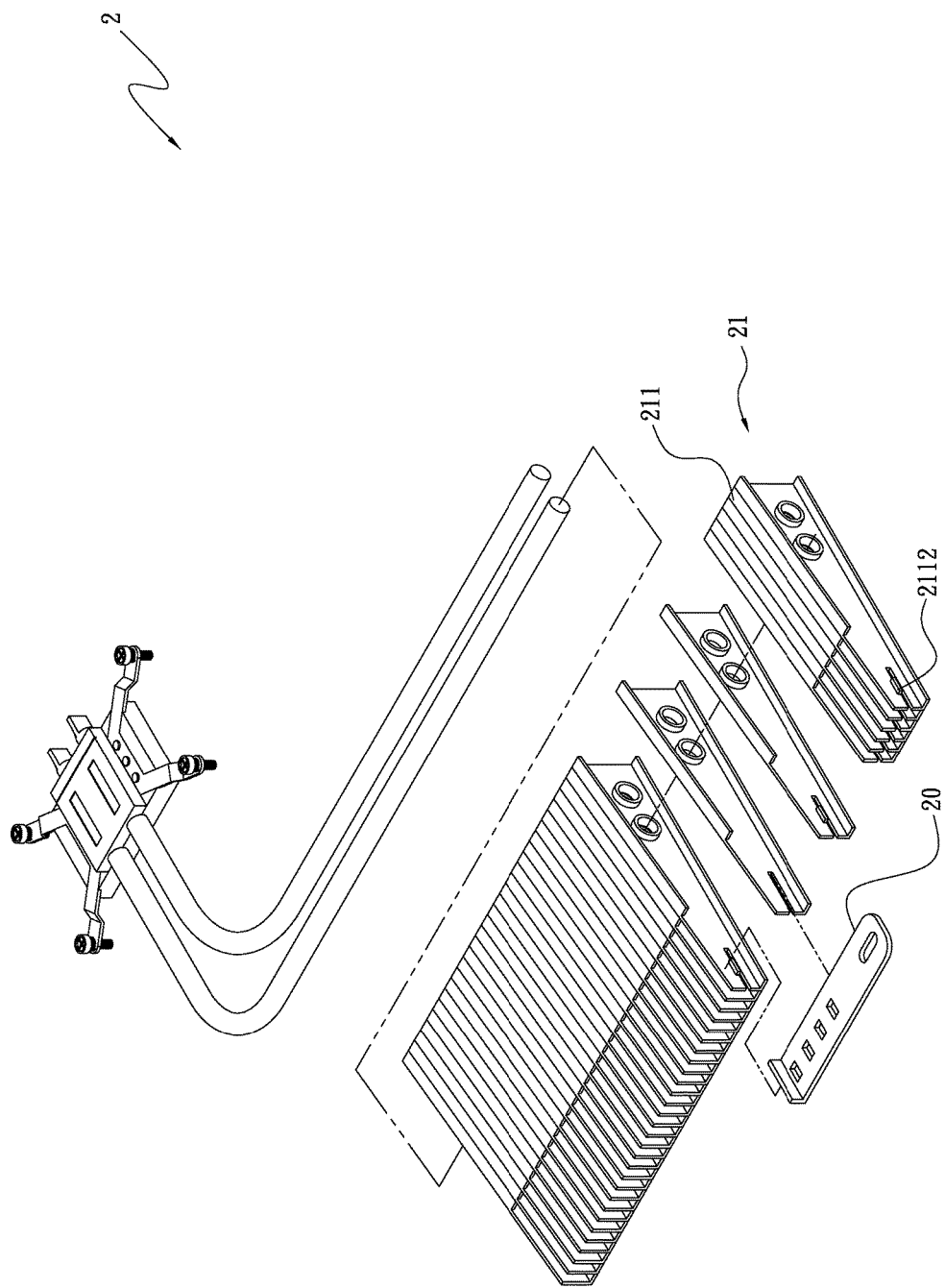
FIG. 6 is an exploded perspective view of a heat dissipation device according to a fourth embodiment of the present invention.

Please refer to FIG. 6 that is an exploded perspective view of a heat dissipation device 2 according to a fourth embodiment of the present invention. As shown, the fourth embodiment is generally structurally similar to the first embodiment, except that, in the third embodiment, the locking portions 2112 are not sequentially provided on all the radiating fins 211 but are arranged at predetermined intervals. With this design, it is also possible to securely connect the mounting bracket 20 to the thermal module 21.

Figure 7:
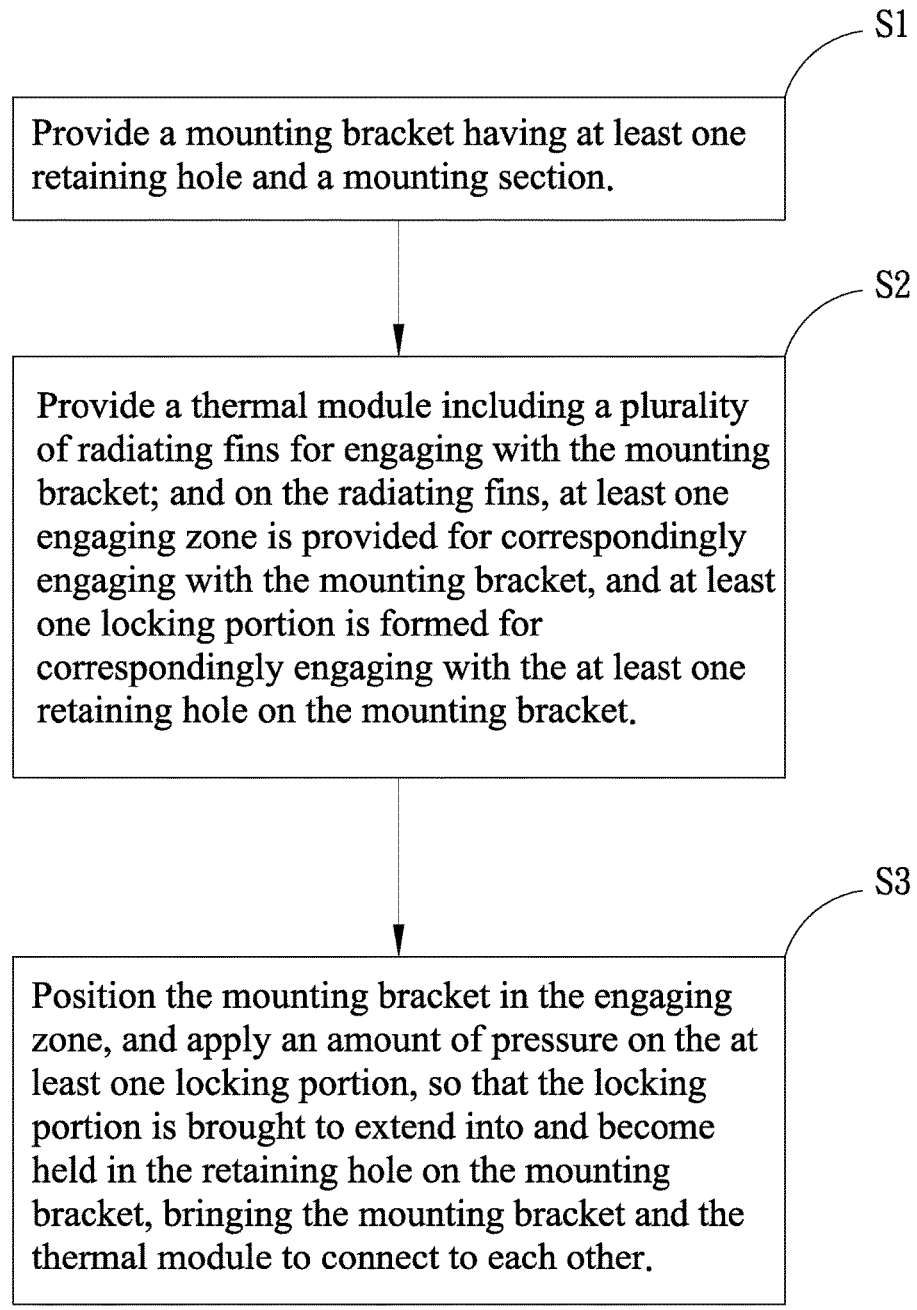
FIG. 7 is a flowchart showing the steps included in a method according to the present invention for manufacturing a heat dissipation device.

The present invention also provides a method of manufacturing heat dissipation device. Please refer to FIG. 7, which is a flowchart showing steps S1, S2, and S3 included in the heat dissipation device manufacturing method of the present invention.

In the step S1, a mounting bracket having at least one retaining hole and a mounting section is provided.

More specifically, a mounting bracket 20 having at least one retaining hole 201 and a mounting section 202 is provided.

In the step S2, a thermal module including a plurality of radiating fins for engaging with the mounting bracket is provided. On the radiating fins, at least one engaging zone is provided for correspondingly engaging with the mounting bracket, and at least one locking portion is formed for correspondingly engaging with the at least one retaining hole on the mounting bracket.

More specifically, a thermal module 21 including a plurality of radiating fins 211 for engaging with the mounting bracket 20 is further provided. On the radiating fins 211, at least one locking portion 2112 is provided for correspondingly inserting into the at least one retaining hole 201 on the mounting bracket 20.

In the step S3, the mounting bracket is positioned in the engaging zone, and an amount of pressure is applied to the at least one locking portion 2112 for the same to extend into the at least one retaining hole and be held therein, so that the mounting bracket and the thermal module are connected to each other.

More specifically, the mounting bracket 20 is positioned in the engaging zone 2111, and an amount of pressure is applied to the at least one locking portion 2112 for the same to extend into the at least one retaining hole 201 and be held therein, so that the mounting bracket 20 and the thermal module 21 are connected to each other.

In the step S3, the at least one locking portion 2112 are brought to engage with the at least one retaining hole 201 by way of mechanical processing. In the illustrated embodiment, the mechanical processing includes but not limited to stamping.

With the above described heat dissipation device manufacturing method, the at least one locking portion 2112 on the radiating fins 211 is stamped to thereby extend into and become engaged with the at least one retaining hole 201 on the mounting bracket 20. In this manner, the mounting bracket 20 can be more accurately located on the radiating fins 211 and more securely connected to the thermal module 21. In addition, it is able to save the cost needed for welding the mounting bracket 20 to the thermal module 21.

In brief, the present invention is superior to the prior art due to the following advantages: (1) the mounting bracket is accurately located on the radiating fins; (2) the mounting bracket is securely connected to the thermal module; and (3) the manufacturing cost is reduced.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation device, comprising: an L-shaped mounting bracket having a first portion, a second portion and a third portion, the first portion having at least one retaining hole, and the second portion having a mounting section; and
   a thermal module including a plurality of discrete radiating fins, to which the mounting bracket is connected; and on the radiating fins, at least one engaging cut out being provided extending inward from an outer edge of an open lateral side of a portion of the fins for correspondingly engaging with the mounting bracket, and at least one locking tab portion being formed on a side of the engaging cut out for correspondingly engaging with the at least one retaining hole of the mounting bracket;
   wherein the mounting bracket is inserted into the engaging cut out on the thermal module from the open lateral side of the radiating fins while the mounting section of the mounting bracket is exposed and protruded out of one end of the thermal module for connecting the heat dissipation device to an electronic element; and wherein the mounting bracket further has at least one stopper portion at the third portion adapted to be inserted in between two adjacent radiating fins to thereby stabilize the location of the mounting bracket.

2. The heat dissipation device as claimed in claim 1, wherein the locking portion is brought to engage with the retaining hole on the mounting bracket by way of mechanical processing.

3. The heat dissipation device as claimed in claim 2, wherein the mechanical processing is stamping.

4. The heat dissipation device as claimed in claim 1, wherein the mounting bracket is inserted into the engaging cut out on the thermal module from an end surface of the assembled radiating fins.

\* \* \* \* \*